US010236340B2

(12) United States Patent
Yedinak et al.

(10) Patent No.: US 10,236,340 B2
(45) Date of Patent: Mar. 19, 2019

(54) TERMINATION IMPLANT ENRICHMENT FOR SHIELDED GATE MOSFETS (71) Applicant: SEMICONDUCTOR COMPONENTS INDUSTRIES, LLC, Phoenix, AZ (US)

(72) Inventors: Joseph Yedinak, Mountain Top, PA (US); Xiaoli Wu, Shanghai (CN)

(73) Assignee: Semiconductor Components Industries, LLC, Phoenix, AZ (US)

( * ) Notice: Subject to any disclaimer, the term of this patent is extended or adjusted under 35 U.S.C. 154(b) by 66 days.

(21) Appl. No.: 15/581,774

(22) Filed: Apr. 28, 2017

(65) Prior Publication Data

US 2018/0315812 A1 Nov. 1, 2018

(51) Int. Cl.
*H01L 29/78* (2006.01)
*H01L 29/06* (2006.01)
*H01L 29/423* (2006.01)
*H01L 29/66* (2006.01)
*H01L 29/10* (2006.01)

(52) U.S. Cl.
CPC ........ *H01L 29/0623* (2013.01); *H01L 29/105* (2013.01); *H01L 29/42356* (2013.01); *H01L 29/66734* (2013.01); *H01L 29/7811* (2013.01); *H01L 29/7813* (2013.01)

(58) Field of Classification Search
CPC ............... H01L 29/0623; H01L 29/105; H01L 29/66734; H01L 29/7813; H01L 29/7811; H01L 29/42356
See application file for complete search history.

(56) References Cited

U.S. PATENT DOCUMENTS

| 6,724,042 B2 | 4/2004 | Onishi et al. |
| 7,397,083 B2 | 7/2008 | Amali et al. |
| 8,304,829 B2 | 11/2012 | Yedinak et al. |
| 2005/0017293 A1 | 1/2005 | Zundel et al. |
| 2005/0116313 A1 | 6/2005 | Lee et al. |
| 2007/0138543 A1 | 6/2007 | Saito |
| 2010/0140695 A1* | 6/2010 | Yedinak .............. H01L 29/7827 257/334 |

FOREIGN PATENT DOCUMENTS

WO  2005065385 A2  7/2005

* cited by examiner

*Primary Examiner* — William F Kraig
*Assistant Examiner* — Pavel Ivanov
(74) *Attorney, Agent, or Firm* — Brake Hughes Bellermann LLP (57) ABSTRACT In a general aspect, a power semiconductor device can include a first trench shield electrode and a second trench shield electrode defined in a semiconductor region, the first and second trench shield electrodes each having a first portion disposed in an active region and a second portion disposed in a termination region. A trench of the first trench shield electrode and a trench of the second trench shield electrode can define a mesa of the semiconductor region therebetween. The device can further include an implant enrichment region disposed in the termination region, the implant enrichment region can be intersected by the first trench shield electrode and the second trench shield electrode, and can have a portion disposed in the mesa of the semiconductor region, the portion extending from the trench of the first trench shield electrode to the trench of the second trench shield electrode.

19 Claims, 8 Drawing Sheets

TERMINATION IMPLANT ENRICHMENT FOR SHIELDED GATE MOSFETS

TECHNICAL FIELD

This description relates to power semiconductor devices. More specifically, this description relates to termination structures for power semiconductor devices with implant enrichment (e.g., implant enrichment regions), such as in termination structures for shielded trench gate metal-oxide semiconductor field-effect transistors (MOSFETs).

SUMMARY

In a general aspect, a power semiconductor device can include a semiconductor region having an active region and a termination region. The device can also include a first trench shield electrode defined in the semiconductor region. The first trench shield electrode can extend along a first longitudinal axis. The first trench shield electrode can have a first portion disposed in the active region and a second portion disposed in the termination region. The device can further include a second trench shield electrode defined in the semiconductor region. The second trench shield electrode can extend along the first longitudinal axis in parallel with the first trench shield electrode. The second trench shield electrode can have a first portion disposed in the active region and a second portion disposed in the termination region. A trench of the first trench shield electrode and a trench of the second trench shield electrode can define a mesa of the semiconductor region therebetween. The device can still further include an implant enrichment region disposed in the termination region. The implant enrichment region can extend along a second longitudinal axis that is orthogonal with the first longitudinal axis. The implant enrichment region can be intersected by the first trench shield electrode and the second trench shield electrode, and can have a portion disposed in the mesa of the semiconductor region. The portion of the implant enrichment region can extend from the trench of the first trench shield electrode to the trench of the second trench shield electrode.

In the drawings, like reference symbols in the various drawings indicate like elements. Reference numbers for some like elements may not be repeated for all such elements. In certain instances, different reference numbers may be used for like elements, or similar elements. Some reference numbers for certain elements of a given implementation may not be repeated in each drawing corresponding with that implementation. Some reference numbers for certain elements of a given implementation may be repeated in other drawings corresponding with that implementation, but may not be specially discussed with reference to each corresponding drawing.

DETAILED DESCRIPTION

Power semiconductor devices (power devices), such as shielded trench gate metal-oxide semiconductor field-effect transistors (MOSFETs), insulated-gate bipolar transistors (IGBTs), etc., can be implemented in a semiconductor die. For instance, a semiconductor die can have an active area (active region, etc.) where an array of semiconductor mesas and trenches that implement a given power device are located. For example, trenches formed in a semiconductor region can define the corresponding semiconductor mesas. Gate electrodes and/or shield electrodes (with corresponding dielectric layers to insulate such electrodes from other elements of the power semiconductor device) can be formed in the trenches, while such other elements of the power device (e.g., a body region, source regions, heavy body regions, collector regions, emitter regions, base regions, etc.) can be defined in the mesas, e.g., between (defined by) the trenches.

The semiconductor die can also include a termination area (field termination area, termination region, etc.) that is disposed around or adjacent to (completely surrounds, partially surrounds, borders, etc.) the active area. The termination region can be used to minimize (reduce, etc.) electric fields around the active area, and may not be configured to conduct current during operation of the power semiconductor device implemented in the active region. In certain implementations, trenches from the active region can extend into, at least a portion of, the termination region to form, at least in part, a termination structure. In the termination region, the trenches can include, for example, shield electrodes formed in the trenches that are electrically coupled to a potential of the power device (e.g. a source potential of a power MOSFET).

While a breakdown voltage (holding voltage) of a power device can be determined by voltage breakdown processes that occur within the active region, various breakdown processes can occur in the termination region that can significantly lower a breakdown voltage (holding voltage, voltage rating) for an associated power device. For example, differences in charge balance (e.g. a large imbalance between available charge at a surface of a mesa in the termination region and available charge at a bottom of the mesa in the termination region) can affect such breakdown voltages. For instance, if an amount of available charge at a surface of a mesa is significantly less (e.g., by an order of magnitude or more) than an amount of available charge at the bottom of the mesa (such as discussed above), this charge imbalance can result in rapid depletion of the termination region at its semiconductor mesa surfaces when an associated power device is in an off-state. This rapid depletion can cause a depletion field from the active area to extend to the end, almost to the end, or beyond the end of the termination structure (e.g., beyond the ends of shield electrode filled trenches in the termination region) at a voltage below a desired breakdown voltage for the power semiconductor device, which can result in a breakdown process occurring in the termination region (e.g., due to impact ionization) and, as a result, reduce a breakdown voltage (holding voltage, voltage rating, etc.) of the associated power device below a desired breakdown voltage.

A number of factors can affect charge balance in such power devices. For instance, certain design features and processing characteristics that are implemented to improve device performance can affect charge balance (e.g., in the termination region). For example, as noted above, spacing between trenches (which results in reduced mesa widths) and use of retrograde doping in a semiconductor region (e.g., an epitaxial semiconductor layer) in which the trenches and mesas are defined can increase such charge imbalance (e.g., cause a greater imbalance between a top and a bottom of a given semiconductor mesa). Use of a retrograde doped semiconductor material (e.g., an epitaxial silicon layer) can result in associated mesas (e.g., between shield electrode trenches) having lower doping in their upper portions (e.g., at and/or near their upper surfaces) than at the bottoms of the mesas (e.g., at and/or near the bottom of trenches defining the mesas). Further, formation of trenches with sloped sidewalls produces mesas that are narrower at their tops than at their bottoms. This variation in width between the tops of the mesas and the bottoms of the mesas can further increase charge imbalance from the upper portions of the mesas to the lower portions of the mesas. Use of termination structures that include implant enrichment, such as those described herein, can compensate for such charge imbalance and increase an electric (depletion) field potential that can be sustained by the termination region, which can prevent the depletion field from extending beyond the termination trenches and causing a breakdown process to occur below a desired breakdown voltage of an associated power semiconductor device.

In this description, example implementations of power semiconductor devices, such as shielded-gate metal-oxide semiconductor field-effect transistors (shielded-gate MOSFETs), that can be implemented in a semiconductor die are described. Such devices can include an active region and a termination region, where a boundary between the active region and the termination region is defined by an edge of a well region (e.g., a P-well region for an N-type MOSFET). For purposes of this discussion, termination region structures for N-type (N-channel) shielded gate MOSFETs are described. However, the approaches described herein could be used to implement other types of devices, such as trench-MOS barrier Schottky (TMBS) rectifiers, P-type (P-channel) shielded gate MOSFETs (e.g., by reversing the conductivity types of the N-type devices described below), shielded-gate IGBT devices, or other power semiconductor devices.

The example implementations described herein include N-enrichment implant regions (stripes, bars, etc.) that are implanted in the termination region, e.g., as bars, stripes, individual segmented regions, etc., across (orthogonal to longitudinal axes of) semiconductor mesas and shield electrode trenches in the termination region, of shielded gate MOSFETs. In the implementations described herein, N-type enrichment implant regions (implant enrichment regions, N-enrichment regions, N-enrichment implant regions, etc.) can be surface implant regions, with a depth 2-6 micrometers (μm), which can be equal to or relatively shallow, as compared to a depth of a 6-14 μm of corresponding termination shield trench structures (e.g., including a shield electrode or oxide filled).

The relative depths of the N-enrichment implant regions and the termination shield trenches will depend on the particular implementation (e.g., may depend on semiconductor process, device operating parameters, such as a desired operating voltage, etc.). The dopant impurities for the N-enrichment implant regions can be implanted early in a corresponding semiconductor manufacturing process (e.g., before forming trenches in which the shield electrodes and/or gate electrodes are disposed). In such approaches, further thermal processing (e.g., after an implant for defining the implant enrichment regions) can cause the initially implanted dopant impurities for the implant enrichment regions to be driven to desired depths and/or widths, e.g., such that the individual implant enrichment regions diffuse laterally and overlap with each other (e.g., as shown in FIGS. 2B, 5B and 7C). In implementations, such implant enrichment regions can be defined using one or more semiconductor processing operations, such as photolithography operations and/or dopant impurity implantation operations.

Such N-enrichment implant regions (e.g., formed in a termination region of an N-type power MOSFET device) can improve (increase) a breakdown voltage in the termination region of a given shielded gate MOSFET (e.g., as compared to devices without such N-enrichment implant regions), such that a breakdown voltage in the termination region is greater than a breakdown voltage in an associated active region (e.g., active cell) of a corresponding shielded gate power MOSFET device. Such increases in breakdown voltage can be achieved (e.g., in an N-type shield-gate trench MOSFET) using N-enrichment implant regions, which can result in improved charge balance between semiconductor mesa surfaces and semiconductor mesa bottoms in the termination region, e.g., when the N-enrichment implant regions are implemented as surface implants. Such improved charge balance can be a result of an increase of free charge available near the mesa surfaces (e.g., from the N-type enrichment implant regions) to support a depletion field (e.g., an off-state field) of an associated power semiconductor device.

As discussed herein, charge imbalance in semiconductor mesas in a termination region (e.g., that can be improved using N-type enrichment implant regions described herein) can be a result of measures that are taken to improve device (MOSFET) performance. These measures can include use of retrograded epitaxial, formed by the diffusion of dopants from multiple epitaxial layers of different doping concentrations, e.g., N-type for N-type MOSFET devices) or silicon layers with doping concentrations that increase with depth and/or shield trenches with angled (sloped) sidewalls, which can result in semiconductor mesas that are narrower at their surface than at their bottom, further exacerbating charge imbalance issues due to reducing available charge near the mesa surfaces.

As discussed herein, termination regions (structures) that are implemented using N-enrichment implant regions (implant enrichment regions) can, for example, have different numbers of N-enrichment implant regions, different dimensions of the N-enrichment implant regions (spacings, widths, etc.) and/or different doping concentrations of the N-enrichment implant regions depending on the particular implementation (e.g., such as desired operating voltage of the associated MOSFET, the particular semiconductor manufacturing process, the doping profile of an epitaxial layer in which a corresponding MOSFET device is implemented, etc.). Use of such implant enrichment regions in termination regions of shielded gate MOSFETs can provide for implementation of termination regions that can be used in shielded gate MOSFET designs without the use of additional termination trenches at active trench ends (e.g., perimeter trenches that include floating poly electrodes), which can be advantageous, as such additional termination trenches can be sources of charge imbalance that result in lower breakdown voltages in the termination region (e.g., at the ends of the termination shield electrode trenches).

Improvements in termination region breakdown voltages achieved using implant enrichment regions in power semiconductor device termination regions can be a result of, e.g., N-type implant enrichment regions (e.g., in a N-type power MOSFET device) providing additional charge near the surfaces of semiconductor mesas in the termination region, where that additional charge helps supports a significant amount of depletion field potential at the termination mesa surfaces and to some depth in the termination mesas, e.g., along a length (a lateral length) of a the termination mesas before the ends of the termination trenches are reached by the depletion field in the adjacent mesas.

Such N-enrichment implant regions can help to achieve similar (or better) vertical charge balance in the termination mesas as compared with vertical charge balance in associated active MOSFET cells (active region). In certain implementations, such N-enrichment implant regions can be combined with oxide filled termination or partially filled shield electrode trenches (rather than full termination shield electrode filled termination trenches) in termination region structures with or without perimeter trenches, where the perimeter trenches (if present) can include floating poly (N-type) electrodes disposed therein, e.g., N-type poly electrodes within a shield dielectric layer that insulates the floating poly electrode from, at least, an epitaxial (N-type) layer in which the MOSFET device is implemented.

Figure 1:
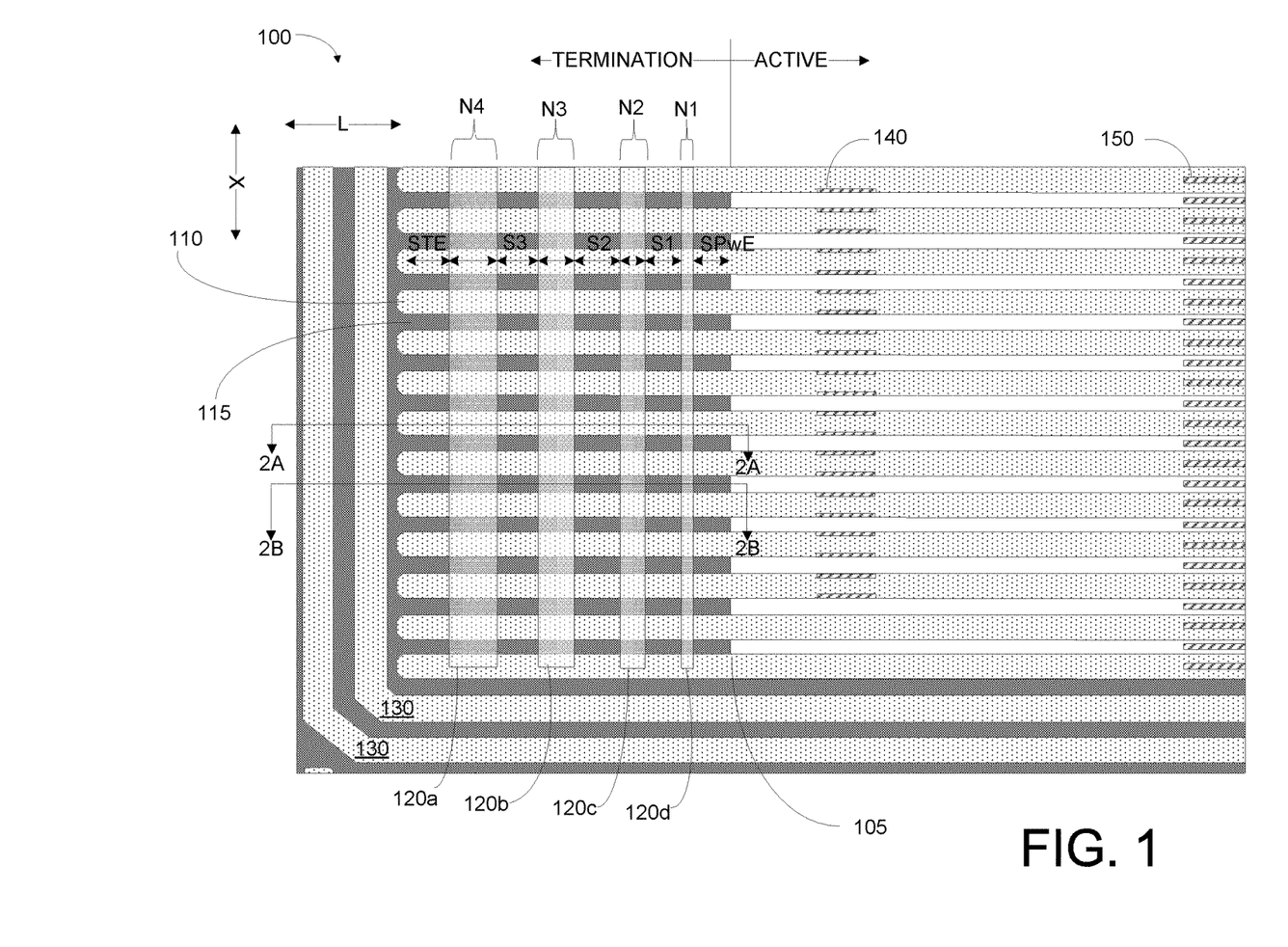
FIG. 1 is a diagram illustrating a plan view of a portion of a termination structure with implant enrichment regions that can be implemented in a power semiconductor device, according to an implementation.

FIG. 1 illustrates an example termination structure for a power semiconductor device, according to an implementation. The termination structure shown in FIG. 1 illustrates a plan (top side) view of a portion (e.g., a section) of a termination structure 100 that can be used in semiconductor dice that include power devices, such as shielded gate (N-type) MOSFETs. As shown in FIG. 1, the illustrated termination structure can extend between an active region and a termination region, where the active region is to the right of a well (P-well) boundary 105 and the termination region is to the left of the P-well boundary 105. The P-well, in this example implementation, can define a body region for a shielded gate MOSFET (e.g., a body region for an associated active MOSFET device cell).

In FIG. 1, for purposes of illustration, the termination structure 100 is shown as a design layout. In other words, the various elements of the termination structure 100 shown in FIG. 1 are illustrated as they may be arranged in a set of photolithography masks that are used in a semiconductor manufacturing process to produce the various elements of a power semiconductor device including the termination structure 100. It will be appreciated that the elements (features, components, etc.) of the termination structure 100 in a completed power semiconductor device (e.g., after completing semiconductor processing) can vary from their arrangement in FIG. 1. For instance, implants (e.g., enrichment implant regions) can diffuse vertically and laterally, such that their widths and depths increase from their dimensions when originally implanted (e.g., such as the widths shown in FIG. 1). The effects of such implant diffusion (as a result of subsequent thermal processing) are illustrated by a comparison of N-enrichment implant regions 120a-120d in FIG. 1 with the N-enrichment implant regions 120a-120d in FIG. 2B, where those enrichment implant regions are laterally spaced in FIG. 1 and laterally overlap each other in FIG. 2B (e.g., as a result of diffusion of the initial implants during thermal processing that is subsequent to implantation). Further, portions of the N-enrichment regions 120a-120d can be removed by subsequent processing, such as when forming trenches in the termination region 100 by removing a portion of an epitaxial layer in which the N-enrichment implants are formed (e.g. at intersections of trenches 110 and the N-enrichment regions 120a-120d in FIG. 1).

As shown in FIG. 1, the termination structure 100 can include a plurality of trenches 110 (e.g., parallel trenches) (for which the portion of the trenches 110 disposed in the termination region can be referred to as termination trenches or termination shield trenches) and corresponding semiconductor mesas 115 (e.g., that define the trenches 110). In this example, each of the trenches 110 can include (have disposed therein) a poly (N-type poly) shield electrode (trench shield electrode) that is coupled to a source potential for a corresponding N-type shielded gate MOSFET device (or active device cell) that is implemented in the active region (to the right of the P-well edge 105). Such a power MOSFET device can include, for example a source region, a body region, a gate electrode, a drift region, a drain region, source metal, source and shield contacts 150, a heavy body region (e.g. contacted with the source metal), etc. For n-channel power MOSFET devices, the source potential can be electrical ground. As further illustrated in FIG. 1, the termination structure 100 can also include a plurality of N-enrichment implant regions 120a, 120b, 120c and 120d, floating perimeter trenches 130, a plurality of gate electrode contacts 140 and a plurality of active region source (e.g., electrical ground) contacts 150 that contact termination shield electrodes (e.g., such as electrode 110a in FIG. 2A) and source regions of the corresponding shielded gate MOSFET device.

The N-enrichment implant regions 120a-120d of the termination structure 100 in FIG. 1 can extend in parallel (e.g., along a longitudinal axis X) with one another and across (be intersected by, or intersect with) the termination trenches 110 and the corresponding semiconductor mesas 115 between the termination trenches 110 in the termination region (e.g., to the left of the P-well edge 105). Said another way, the N-enrichment implant regions 120a-120d can be orthogonal to an axis L, along which the termination trenches 110 are disposed. For reference between the various drawings, the axes L and X are shown in the other figures, where appropriate.

Other implementations, as compared to the termination structure 100, can include additional or fewer N-enrichment implant regions (implant enrichment regions), or can have N-enrichment implant regions (implant enrichment regions) having other configurations (e.g., shape, size, etc.). A doping concentration of the N-enrichment implant regions 120a-120d (or other implant enrichment regions) will depend on the particular implementation of a given termination structure. In implementations, the implant enrichment regions 120a-120d (or other implant enrichment regions) can be defined with an implant (e.g., a surface implant) having an impurity dose (e.g., N-type dose) of greater than or equal to $2.5 \times 10^{13}/cm^2$. For instance, the impurity dose for defining such implant enrichment regions can be greater than or equal to $4.5 \times 10^{13}/cm^2$, greater than or equal to $6.5 \times 10^{13}/cm^2$, or greater than or equal to $8.5 \times 10^{13}/cm^2$. These implant doses can be higher or lower depending on a width of an implant used to define a given enrichment region stripe, spacing from other enrichment region stripes, a vertical charge profile in a corresponding semiconductor mesa in the termination region (e.g., between termination trench shield electrodes), and a thickness of a shield oxide (shield dielectric) used in the termination trench shield electrodes.

As noted above, the floating perimeter trenches 130 can include a floating poly (N-type poly) electrode that is disposed on a dielectric layer (e.g., a shield dielectric layer) that lines the trenches of the floating perimeter trenches 130 and the trenches 110 (e.g., on which respective shield electrodes in the trenches 110 are disposed). In other implementations, the floating perimeter trenches 130 can be eliminated, such as in the example implementation shown in FIG. 6.

In the termination structure 100 shown in FIG. 1, a number of dimensions are indicated in association with the N-enrichment implant regions 120a-120d. The relative arrangement, dimensions and spacings shown in FIG. 1 are given by way of example and for purposes of illustration, may not be to scale, and/or may be different in other implementation. In the example of FIG. 1, dimensions SPwE, S1, S2, S3, STE, N1, N2, N3 and N4 are shown. In this example, SPwE is a spacing between the well edge 105 and the implant enrichment region 120d; S1 is a spacing between the implant enrichment region 120d and the implant enrichment region 120c; S2 is a spacing between the implant enrichment region 120d and the implant enrichment region 120b; S3 is a spacing between the implant enrichment region 120b and the implant enrichment region 120a; and STE is a spacing between the implant enrichment region 120a and the ends of the trenches 110 in the termination region.

Further in the example implementation of FIG. 1, N1 is a width, along the axis L, of the implant enrichment region 120d; N2 is a width, along the axis L, of the implant enrichment region 120c; N3 is a width, along the axis L, of the implant enrichment region 120b; and N4 is a width, along the axis L of the implant enrichment region 120a. In other implementations, other dimensions could be specified or defined. Further, each of these dimensions can vary based on the particular implementation. In an example implementation, the above dimensions can each be in a range of 1-5 microns. In other implementations, one or more of the dimensions described above can be less than 1 micron, or greater than 5 microns. In implementations, a sum of the distances (spacings) indicated above for the termination structure 100 can be 24 microns. In other embodiments, a sum of the distances (spacings) STE, N4, S3, N3, S2, N2, S1, N1 and SPwE can be less than or greater than 24 microns.

In some implementations, S1, S2, and/or S3 can be greater than the width of N4, N3, N2, and/or N1. In some implementations, S1, S2, and/or S3 can be less than the width of N4, N3, N2, and/or N1. In some implementations, S1, S2, and/or S3 can be equal to the width of N4, N3, N2, and/or N1. In some implementations, N4 can have a width greater than the width of any of N3 through N1. In some implementations, N3 can have a width greater than the width of N2 or N1. In some implementations, N2 can have a width greater than the width of N1. In some implementations, less enrichment regions can be included than shown in FIG. 1, or more enrichment regions can be included than shown in FIG. 1.

Figure 2A:
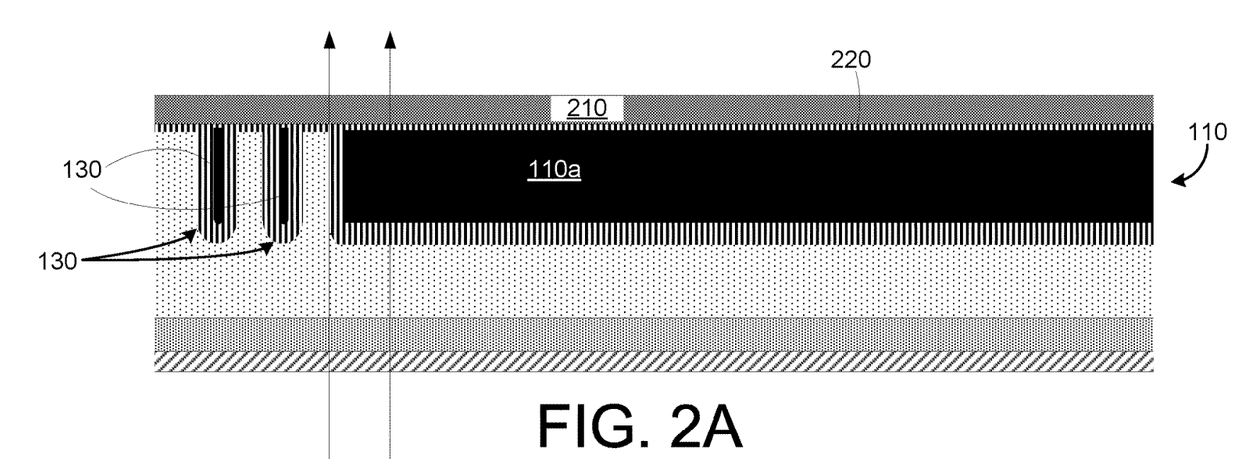
FIGS. 2A and 2B are diagrams illustrating cross-sectional views of the termination structure of FIG. 1 along corresponding section lines in FIG. 1, according to an implementation.
Figure 2B:
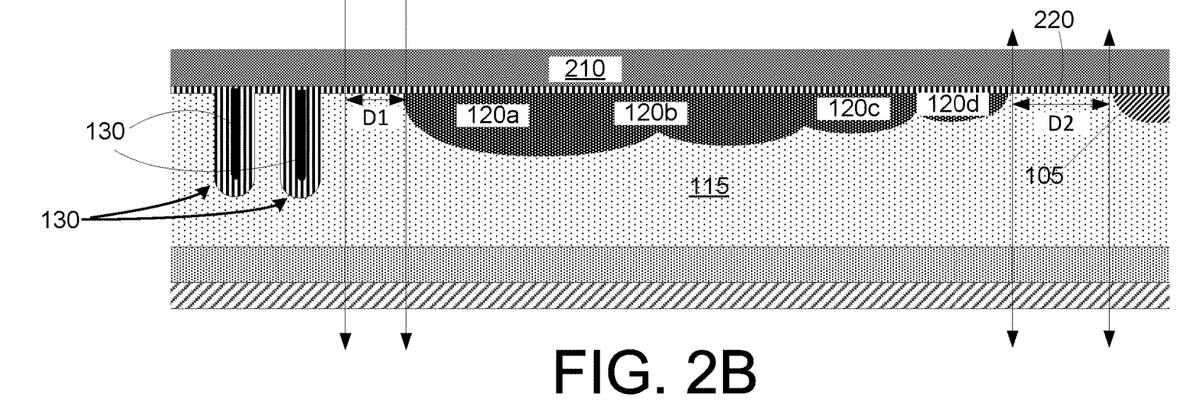

FIGS. 2A and 2B are diagrams illustrating cross-sectional views of the termination structure 100 of FIG. 1 along corresponding section lines in FIG. 1, according to an implementation. FIG. 2A illustrates a cross-sectional view along section line 2A-2A in FIG. 1 (e.g., along a trench 110). In FIG. 2A, the cross-section also illustrates the perimeter trenches 130 and an example structure that can be included in the termination trench 110. As shown in FIG. 2A, the perimeter trenches 130 can include a dielectric liner 220, such as a shield oxide, as well as polysilicon electrodes 130a. As also shown in FIG. 2A, the dielectric liner 220 can also be included in the trench 110 along with a polysilicon electrode 110a. As discussed herein, the polysilicon electrode 110a can be a trench shield electrode that is coupled to a source potential (e.g., electrical ground) of a corresponding power semiconductor device. Depending on the implementation, the polysilicon electrodes 130a could be floating or tied to source potential. In other implementations, one or both of the perimeter trenches 130 could be dielectric filled (e.g., without including a polysilicon electrode 130a).

As also shown in FIG. 2A (and FIG. 2B), an inter-layer dielectric 210 can be included in (e.g., disposed on) the termination structure 100 (or in other termination structures). As noted above, in an implementation, a depth of perimeter trenches 130 and the termination trench 110 can be on the order of 6-14 µm. In other implementations, the trenches 110 and 130 can be shallower or deeper. The N-enrichment implants 120a-120d are not present in FIG. 2A, as the formation of the trench 110 removes a portion of the enrichment implants (e.g., where they intersect with the trench 110).

FIG. 2B illustrates a cross-sectional view along section line 2B-2B in FIG. 1, which is along a mesa 115 of the termination structure 100. The perimeter trenches 130 are also shown in FIG. 2B (e.g., including polysilicon electrodes 130a disposed on dielectric liner 220. Also shown in FIG. 2B are the N-enrichment implant regions 120a-120d. As discussed above, the N-enrichment implant regions 120a-120d in FIG. 2B are illustrated as overlapping each other, which overlap can occur as a result of diffusion of the N-enrichment implant regions 120a-120d as shown in FIG. 1 due to thermal processing that occurs subsequent to implanting the stripes of the N-enrichment implant regions 120a-120d. Such an arrangement can provide a desired graded lateral doping profile, which can increase available surface charge in the mesa 115. This increased surface charge can improve charge balance and prevent breakdown from occurring in the termination region of the termination structure 100 before it occurs in the active region (e.g., in an active cell of a corresponding power semiconductor device).

FIGS. 2A and 2B also illustrate the spacing (as distance D1) between an end of the termination trench 110 and a nearest edge of the N-enrichment implant region 120a. It will be appreciated that, as a result of the lateral diffusion of the N-enrichment implant stripes 120a-120d shown in in FIG. 1, the distance D1 may be less than the corresponding distance (spacing) STE between the end of the termination trench 110 and the nearest edge of the N-enrichment region 120a stripe in FIG. 1. Further, FIG. 2B also illustrates the spacing (as distance D2) between the edge of the active area P-well 105 and a nearest edge of the N-enrichment implant region 120d. As with the distance D1, as a result of the lateral diffusion of the N-enrichment implant stripes 120a-120d shown in FIG. 1, the distance D2 may be less than the distance (spacing) SPwE between the edge of the active area P-well 105 and the nearest edge of the N-enrichment implant region 120d in FIG. 1.

As also shown in FIG. 2B, a depth of the N-enrichment region 120a (e.g., after lateral and vertical diffusion) can have a depth that is greater than respective depths of any of the N-enrichment implant regions 120b-120d. The N-enrichment region 120b (e.g., after lateral and vertical diffusion) can have a depth that is greater than the respective depths of both the N-enrichment regions 120c and 120d. The N-enrichment region 120c (e.g., after lateral and vertical diffusion) can have a depth that is greater than the depth of the N-enrichment region 120d. As noted above, in some implementations, the depths of the N-enrichment implant regions 120a-120d (e.g., after diffusion due to thermal processing subsequent to implanting the N-enrichment region stripes shown in FIG. 1) can be less than or equal to 6 μm. In other implementations, other depths are possible.

Figure 3A:
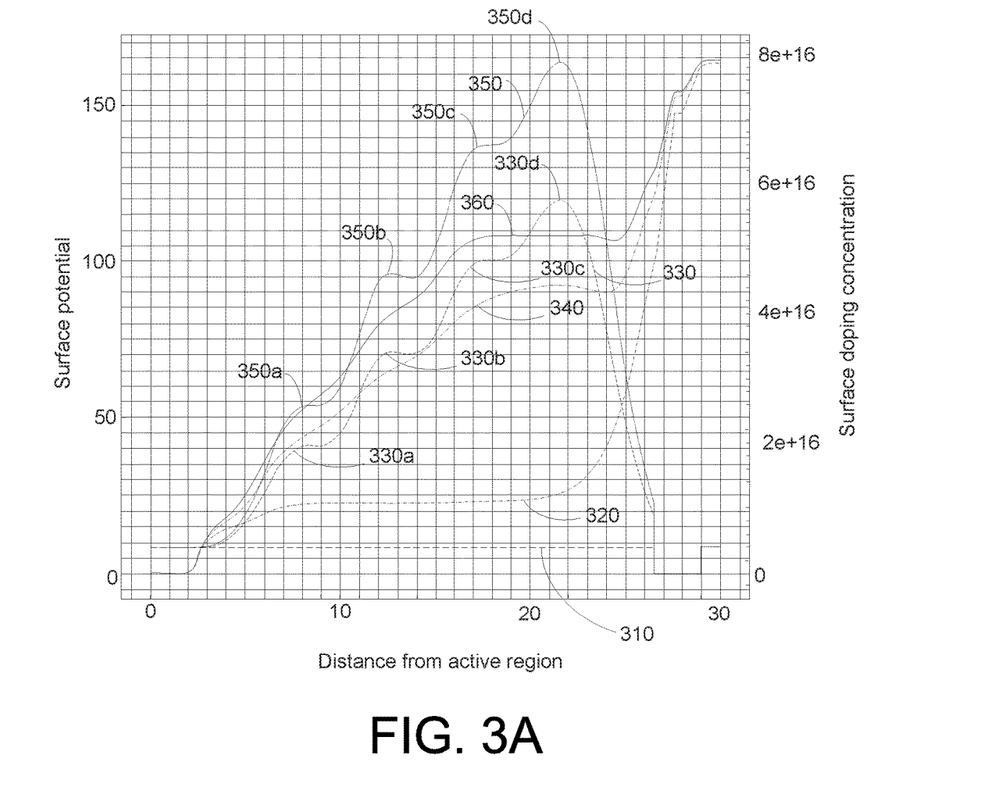
FIGS. 3A, 3B, 3C and 3D are diagrams illustrating simulation results for example implementations the termination structure of FIG. 1 compared with a termination structure without implant enrichment regions, according to implementations.
Figure 3B:
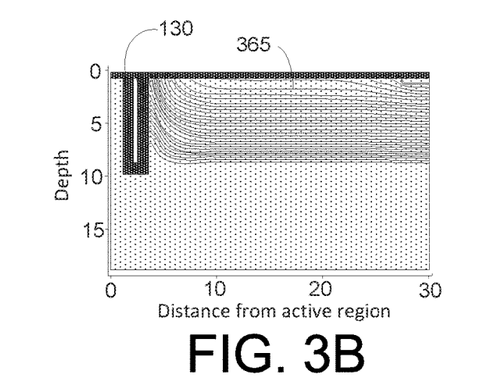
Figure 3C:
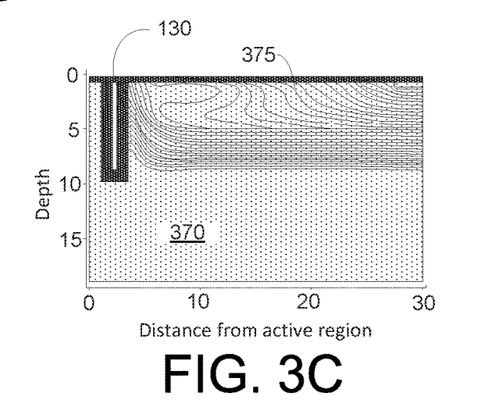
Figure 3D:
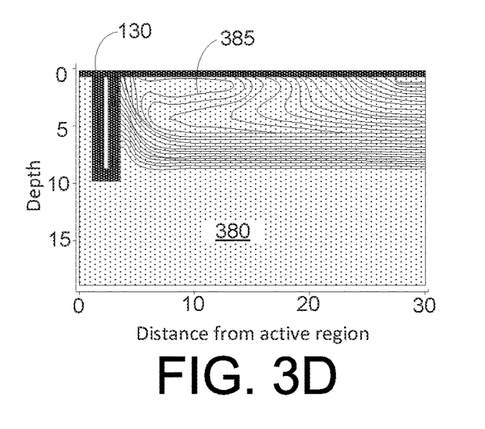

FIGS. 3A-3D illustrate simulation results for two shielded gate MOSFET devices that include respective implementations of the termination structure 100 shown in FIG. 1 with different doping concentrations in their implant enrichment regions 120a-120d, as compared with simulation results for a MOSFET device that includes the termination structure 100 without the N-enrichment implant regions 120a-120d implemented. FIG. 3A is a graph illustrating surface doping concentrations and surface electrostatic potential along a mesa 115 of the termination structure during depletion (e.g., an off-state) of corresponding MOSFET devices. FIGS. 3B-3D are diagrams illustrating potential curves along a cross-section of a mesa 115 in the termination region for each of the devices of FIG. 3A.

In FIG. 3A, surface doping concentrations along a mesa 115 (with distance from the active region being shown along the X-axis) for implementations of the termination structure 100 with different doping concentrations in the N-enrichment implant regions 120a-120d are illustrated by dashed lines 330 and 350 in conjunction with the y-axis on the right side of the graph in FIG. 3A.

Graded lateral doping that increases from the active area to a termination trench end can be achieved by adjusting an implant area width and/or reducing a spacing of the n-enrichment implants (e.g., from the N-enrichment implant region 120d) to the edge 105 of the active region P-well (distance D1) and a spacing (e.g., from the n-enrichment implant region 120a) to the trench end (distance D2). Examples of distances D1 and D2 are discussed above with respect to FIG. 1 (e.g., distances SPwE and STE, respectively). Such a doping profile can be used to produce and/or achieve a constant (substantially constant) lateral electric field profile, so as to support increased voltage (as compared to a device without N-enrichment implants) in the termination region before the trench end is reached, which can prevent breakdown from occurring in the termination region. For instance, in such implementations, a voltage that is supported in the termination region before the termination trench end (e.g., between the P-well edge 105 and the trench end) or a recessed poly edge (e.g., as shown in FIG. 7B) should be sufficient to achieve a same or higher breakdown voltage (BV) than a corresponding vertical breakdown in a corresponding active cell, such that avalanche breakdown (during operation) is initiated in the active cell (active area or active region) before it is initiated in the termination region (e.g., at the termination trench ends). Such operation is desirable because, when avalanche is initiated in a termination region, device performance trade-offs, e.g., RDson vs drain-to source BV (BVdss), can be compromised. Also, device reliability can be improved by reducing a peak electric field stress in the termination region silicon, particularly at a surface of the termination trench end. Surface doping concentration for a MOSFET (e.g., such as a power semiconductor device including the termination structure 100) without such N-enrichment implant regions 120a-120b is illustrated by dashed line 310 (which is constant as there are no N-enrichment implant regions).

Further in FIG. 3A, surface potential (during depletion) along a mesa 115 (with distance from the active region being shown along the X-axis) for implementations of the termination structure 100 with different doping concentrations in the N-enrichment implant regions 120a-120d are illustrated by solid lines 340 (which corresponds with the doping concentration line 330) and 360 (which corresponds with the doping concentration line 330) in conjunction with the y-axis on the left side of the graph in FIG. 3A. Surface potential for a MOSFET without the N-enrichment implant regions 120a-120d is illustrated by solid line 320 (which corresponds with the doping concentration dashed line 310). In this example, the N-enrichment implant regions 120a-120d of the MOSFET device corresponding with lines 330 (doping concentration) and 340 (surface electrostatic potential) have a doping concentration that is less than a doping concentration of the N-enrichment implant regions 120a-120d of the MOSFET device corresponding with lines 350 (doping concentration) and 360 (surface potential). In this example, the implant enrichment regions 120a-120d for a device corresponding with line 330 and 340 in FIG. 3A can be formed using an implant dose of approximately $2.5 \times 10^{13}/\text{cm}^2$. In comparison, the implant enrichment regions 120a-120d for a device corresponding with line 350 and 360 in FIG. 3A can be formed using an implant dose of approximately $3.5 \times 10^{13}/\text{cm}^2$.

FIGS. 3B, 3C and 3D are graphs illustrating respective potential contours along a cross-section of a mesa 115 (e.g., from the active region/P-well edge 105 and through the inner floating perimeter trench 130 of the termination structure 100, such the cross section shown in FIG. 2B without the outer perimeter trench 130 shown in FIGS. 3B-3D) for the various MOSFET implementations of FIG. 3A described above. In FIGS. 3B-3D, depth from a surface of the corresponding mesa 115 for these examples is shown along the y-axis while distance from the active region (e.g., from P-well edge 105) is shown along the x-axis. In FIGS. 3B-3D, the values on the X-axis and Y-axis can be in micrometers (e.g., lateral distance and depth, respectively).

The inner floating perimeter trench 130 of the termination structure 100 is also shown in FIGS. 3B-3D. In the potential contour curves of FIGS. 3B-3D, the potential (voltage) difference between one potential contour curve and a next (adjacent) potential contour curve can be approximately 10 V. In other implementations, the potential difference between potential contour curves could be greater than or less than 10 V.

FIG. 3B is a graph 360 that shows depletion potential contours (potential contour curves) 365 for a cross-section along a mesa 115 of the device corresponding with lines 310 (surface doping concentration) and 320 (surface potential) in FIG. 3A (the MOSFET without N-enrichment implant regions). FIG. 3C is a graph 370 that shows depletion potential contours (potential contour curves) 375 for a cross-section along a mesa 115 of the device corresponding with lines 330 (surface doping concentration) and 340 (surface potential) in FIG. 3A (the MOSFET with lighter doping concentration in the N-enrichment implant regions 120a-120d). FIG. 3D is a graph 380 that shows depletion potential contours (potential contour curves) 385 for the device corresponding with lines 350 (surface doping concentration) and 360 (surface potential) in FIG. 3A (the MOSFET with heavier doping concentration in the N-enrichment implant regions 120a-120d).

As shown by FIGS. 3A-3D, the device without N-enrichment implant regions (corresponding with lines 310 and 320 in FIG. 3A and the potential contours of FIG. 3B) sustains very little voltage across the termination region with the majority of the depletion potential in the termination region being pushed (dropped) at the end of the termination shield trenches (e.g., at the floating perimeter trench 130), which is undesirable as it can result in a reduced breakdown voltage, as discussed above. In comparison, the device with the lower doping concentration in the N-enrichment implant regions 120a-120d (corresponding with lines 330 and 340 in FIG. 3A and potential contours of FIG. 3C) sustains more voltage across the termination region than the device without N-enrichment implant regions, which desirably increases the breakdown voltage in the termination region, and can increase the overall device breakdown voltage. Further, the device with the higher doping concentration in the N-enrichment implant regions 120a-120d (corresponding with lines 350 and 360 in FIG. 3A and potential contours of FIG. 3D) sustains more voltage across the termination region than the device without N-enrichment implant regions and the device with the lower doping concentration in the N-enrichment implant regions 120a-120d, which desirably increases the breakdown voltage in the termination region even further. In other implementations, higher doping concentrations in the N-enrichment implant regions 120a-120d can adversely affect breakdown termination voltage (e.g., by reversing charge imbalance in the semiconductor mesas). Accordingly, the doping concentration for N-enrichment implant regions should be determined based on the particular implementation. As noted above, the implant doses of the n-enrichment implant regions 120a-120d can be based on the width of implanted regions, spacing of the implanted regions, and a vertical charge profile in the termination mesa 115.

Figure 4:
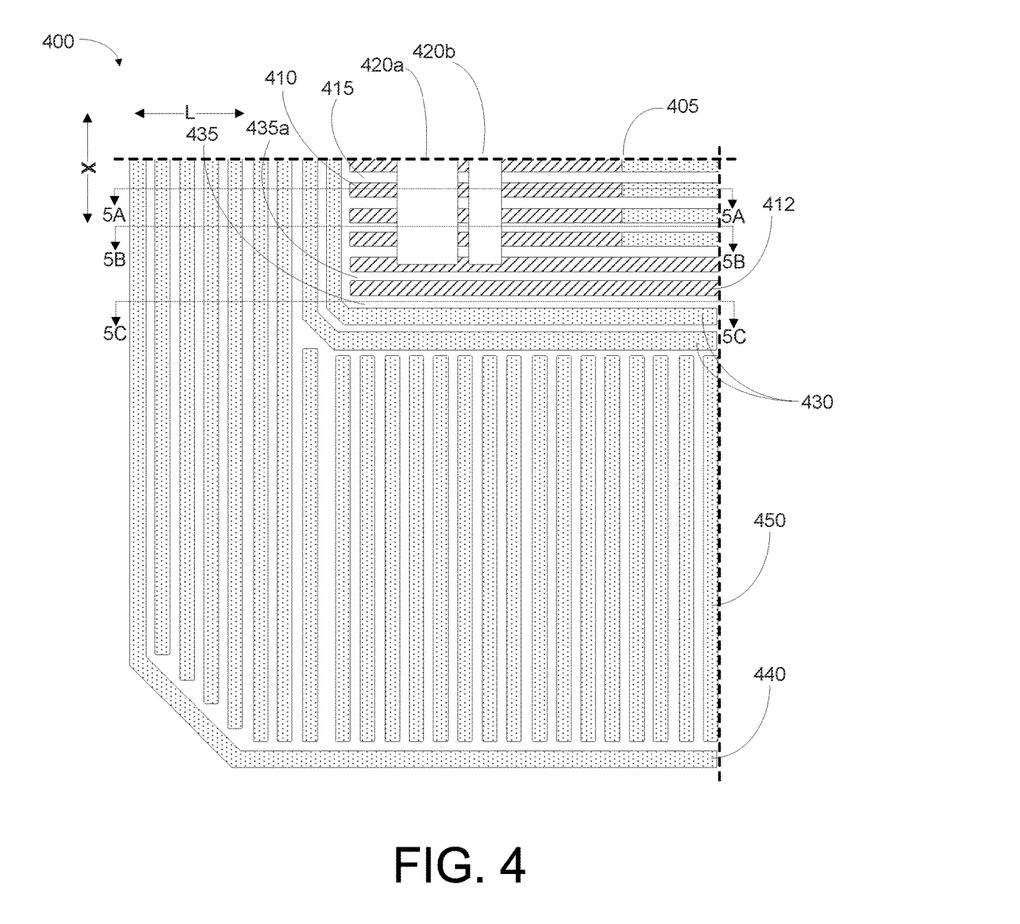
FIG. 4 is a diagram illustrating a plan view of a portion of another termination structure with implant enrichment regions that can be implemented in a power semiconductor device, according to an implementation.

FIG. 4 is a diagram that schematically illustrates a plan (top side) view of a portion (e.g., a section) of a design layout of another implementation of a termination structure 400. The termination structure 400, as shown in FIG. 4, includes trenches 410 (e.g., that can have N-type poly shield electrodes coupled to electrical ground on a dielectric liner disposed therein), silicon mesas 415 between the trenches 410, N-enrichment implant regions 420a and 420b (e.g., extending orthogonally, along axis X, to the longitudinal axis L along which trench shield electrodes, e.g., such as electrode 410a in FIG. 5A, and the semiconductor mesas 415 are arranged) and floating perimeter trenches 430. The dimensions and spacing of the elements in the termination structure 400 can depend on the particular implementation. The P-well edge (e.g., the active region/termination region boundary) is shown as 405 in FIG. 4, and the P-well can be located (formed, etc.) to define an active region as appropriate for a given implementation.

In the termination structure 400, a polysilicon electrode disposed in the trench 410 can be grounded (e.g., at source potential of an associated N-type power MOSFET) and a mesa 435 between a trench 412 and a trench 430 (e.g., a polysilicon electrode disposed in the trench 430) can be electrically floating. Accordingly, in such an arrangement, N-enrichment implants can be omitted from the mesa 435. Omitting the N-enrichment implants from the mesa 435 can prevent a localized high field stress region at a surface of the mesa 435, which, if the N-enrichment implants were included in the mesa 435, could cause a localized BV below a desired BV level for a corresponding power semiconductor device.

Similarly, in the termination structure 400, the a polysilicon electrode disposed in the trench 410 can be grounded (e.g., at source potential of an associated N-type power MOSFET) and a mesa 435a between the trench 412 and a trench 410 (e.g., a polysilicon electrode disposed in the trench 410) can be electrically floating. Accordingly, in such an arrangement, N-enrichment implants can be omitted from the mesa 435a. Omitting the N-enrichment implants from the mesa 435a can prevent a localized high field stress region at a surface of the mesa 435a, which, if the N-enrichment implants were included in the mesa 435a, could cause a localized BV below a desired BV level for a corresponding power semiconductor device. The cross-section of the mesa 435a can be the same or similar to the cross-section of the mesa 435, as shown in FIG. 5C.

In the termination structure 400, trenches 450 act as trenches for improving the process uniformity for chemical-mechanical planarization (CMP) processing. The trenches 450 (e.g., polysilicon electrodes disposed in the trenches 450) can be floating and, during operation, can couple (float) to a drain potential of an associated power semiconductor device. In implementations, the trenches 450 can be filled with a shield poly electrode and an oxide (dielectric) liner, oxide filled, filled with a combination of a partially recessed shield polysilicon electrode and oxide, or filled with a partially recessed shield polysilicon electrode with gate polysilicon disposed on top of the partially recessed shield electrode. The particular structures included in the trenches 450 can depend on how many layers are included in an associated power semiconductor device, and which of those layers are processed using CMP. As shown in FIG. 4, the device 400 also includes an encircling trench 440. In an implementation, the trench 440 can have a similar (same) structure dispose therein as the trenches 450. In other implementations, the trench 440 and the trenches 450 can have different structures disposed therein. That is, the trench 440 could be dielectric filled and the trenches 450 could have floating polysilicon electrodes (on a dielectric layer) disposed therein. In implementations, the trench 440 can perform as a channel stopper trench (e.g., as a buried field plate) to prevent depletion from reaching a semiconductor die scribeline area.

Figure 5A:
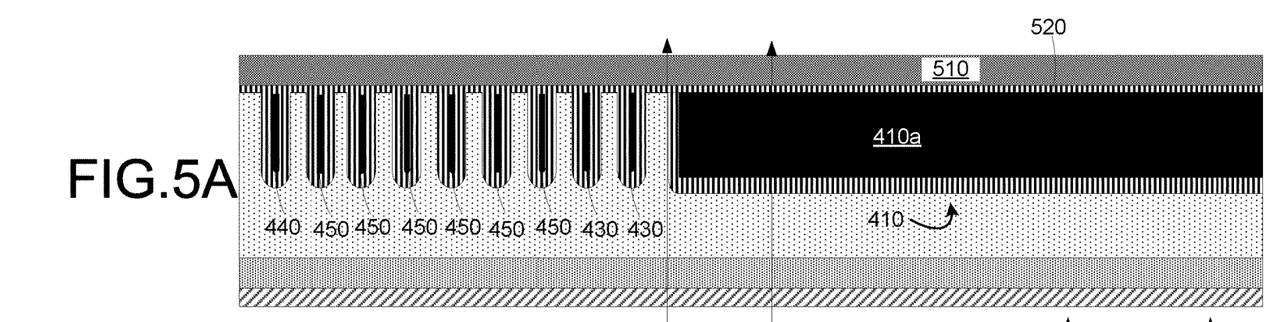
FIGS. 5A, 5B and 5C are diagrams illustrating cross-sectional views of the termination structure of FIG. 4 along corresponding section lines in FIG. 4, according to an implementation.
Figure 5B:
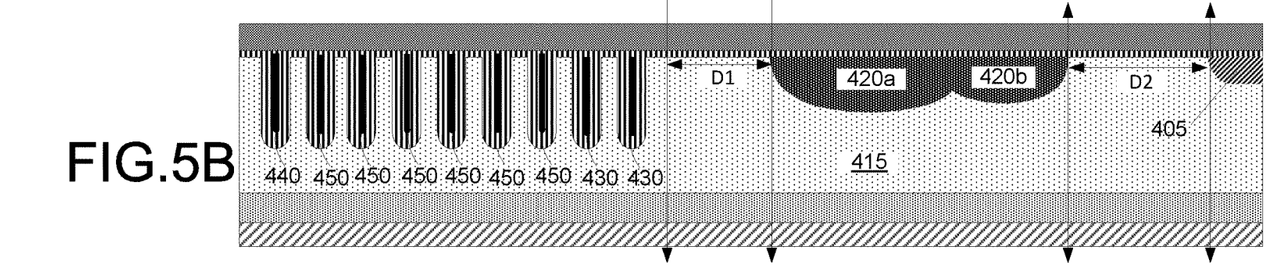
Figure 5C:
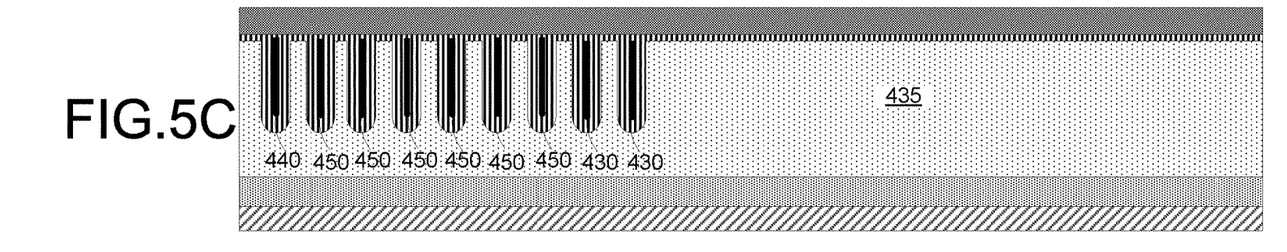

FIGS. 5A-5C are diagrams illustrating cross-sectional views of the termination structure of FIG. 4 along corresponding section lines in FIG. 4, according to an implementation. In each of the cross-sections shown in FIGS. 5A-5C, the perimeter trenches 430, the loading trenches 450 and the encircling trench 440 are shown. These trenches can include structures as those described herein. For instance, the trenches 430, 440 and 450 can (as shown in FIGS. 5A-5C) include (have disposed therein) polysilicon electrodes that are disposed on a dielectric liner 520. The polysilicon electrodes can be tied to a potential (e.g., source potential) or can be floating. In other implementations, one or more of the trenches 430, 440 and 450 can be dielectric filled (and not include a polysilicon electrode therein).

As shown in FIG. 5A, which is a cross-section view along section line 5A-5A in FIG. 4, the trench (termination trench) 410 can have a similar structure as the termination trench 110 shown in FIG. 2A disposed therein. For instance, the termination trench 410 can include a polysilicon electrode 410a (e.g., that is tied to a source potential of a corresponding power semiconductor device), where the electrode 410a is disposed on the dielectric liner layer 520. As shown in FIGS. 5A-5C, the termination structure 400 of FIG. 4 can include (have disposed thereon) an inter-layer dielectric layer 510. The dimensions (e.g., depths) of the trenches 410, 430, 440 and 450 can be similar to those described herein. The N-enrichment implants 420a and 420b are not present in FIG. 5A, as the formation of the trench 410 removes a portion of the enrichment implants (e.g., where they intersect with the trench 410).

FIG. 5B illustrates a cross-sectional view along section line 5B-5B in FIG. 4, which is along a mesa 415 of the termination structure 400, and illustrates the N-enrichment implant regions 420a and 420b. As discussed above with respect to FIGS. 1 and 2B, the N-enrichment implant regions 420a and 420b in FIG. 5B are illustrated as overlapping each other. As noted above, such overlap can occur as a result of diffusion of the N-enrichment implant region 420a and 420b as shown in FIG. 4 due to thermal processing that occurs subsequent to implanting the stripes of the N-enrichment implant regions 420a and 420b. Such an arrangement can provide a desired graded lateral doping profile, which can increase available surface charge in the mesa 415. This increased surface charge can improve charge balance and prevent breakdown from occurring in the termination region of the termination structure 400 before it occurs in the active region (e.g., in an active cell of a corresponding power semiconductor device).

FIGS. 5A and 5B also illustrate a spacing (as the distance D1) between an end of the termination trench 410 and a nearest edge of the N-enrichment implant region 420a. In similar fashion as discussed above with respect to FIGS. 1 and 2B, it will be appreciated that, as a result of the lateral diffusion of the N-enrichment implant stripes 420a and 420b shown in in FIG. 4, the distance D1 in FIG. 5B may be less than the corresponding distance (spacing) between the end of the termination trench 410 and the nearest edge of the N-enrichment region 420a stripe in FIG. 4. Further, FIG. 5B also illustrates a spacing (as the distance D2) between the edge of the active area P-well 405 and a nearest edge of the N-enrichment implant region 420b. As with the distance D1, as a result of the lateral diffusion of the N-enrichment implant stripes 420a and 420b shown in in FIG. 4, the distance D2 in FIG. 5B may be less than the corresponding distance (spacing) between the edge of the active area P-well 405 and the nearest edge of the N-enrichment implant region 420b in FIG. 4.

As also shown in FIG. 5B, a depth of the N-enrichment region 420a (e.g., after lateral and vertical diffusion) can have a depth that is greater than a depth of the N-enrichment implant region 420b. As noted above, in some implementations, the depths of the N-enrichment implant regions 420a and 420b (e.g., after diffusion due to thermal processing subsequent to implanting the N-enrichment region stripes shown in FIG. 4) can be less than or equal to 6 μm. In other implementations, other depths are possible.

FIG. 5C is a diagram that illustrates a cross-sectional view along section line 5C-5C in FIG. 4, which is along a mesa 435 of the termination structure 400. As compared with FIG. 5B, the cross-section in FIG. 5C does not include the N-enrichment implant regions 420a and 420b, as was discussed above with respect to FIG. 4. As noted above, such an arrangement can prevent a localized high field stress region at a surface of the mesas 435 and 435a and, accordingly, prevent localized breakdown (in the mesas 435 and 435a) from occurring below a desired BV level (e.g., less than a BV in an active region) for a corresponding power semiconductor device.

Figure 6:
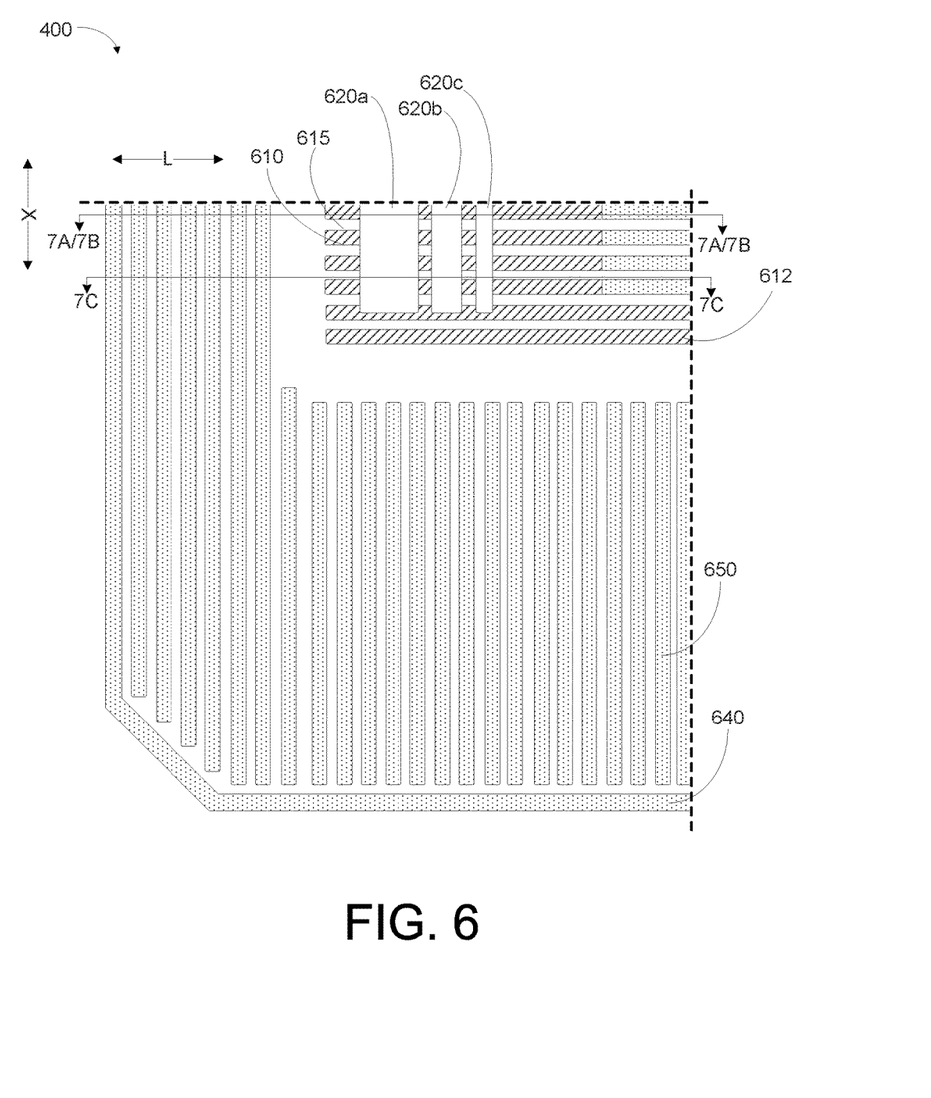
FIG. 6 is a diagram illustrating a plan view of a portion of another termination structure with implant enrichment regions that can be implemented in a power semiconductor device, according to an implementation.

FIG. 6 is a diagram that schematically illustrates a plan (top side) view of a portion (e.g., a section) of a design layout of yet another implementation of a termination structure 600. The termination structure 600, as shown in FIG. 6, can include trench shield electrodes that are disposed in trenches 610 (e.g., N-type poly electrodes coupled to electrical ground disposed on a shield dielectric liner), silicon mesas 615 and three N-enrichment implant regions 620a, 620b and 620c (e.g., extending orthogonally, along axis X, with respect to longitudinal axes of trench shield electrodes, e.g., such as electrode 610a in FIG. 7A, and the semiconductor mesas 615, which are arranged along axis L).

The termination structure 600, as compared with the termination structures 100 and 400, does not include floating perimeter trenches at the ends of the trenches 610, 612 or surrounding the active region and termination region of a given power device (e.g., such as the floating perimeter trenches 130 and 430 in FIGS. 1 and 4). In certain implementations, use of floating perimeter trenches can be undesirable as they can affect charge balance at the ends of the termination shield trenches (e.g., cause a charge imbalance) and, therefore, can reduce a breakdown voltage in the termination region. As with the other example implementations described herein, the dimensions and spacings of the elements in the termination structure 600 can depend on the particular implementation. As in the termination structure 400 of FIG. 4, the P-well edge (e.g., the active region/termination region boundary) of the termination structure 600 is shown as 605 in FIG. 6, and the P-well can be located (formed, etc.) as appropriate for a given device design.

In the termination structure 600 of FIG. 6, the trench 612, trenches 650 and trench 640 can be implemented in similar ways as, respectively, the trench 412, the trenches 450 and the trench 440 of the termination structure 400 of FIG. 4. Accordingly, for purposes of brevity, the specific implementation details of those trenches are not described again here with respect to FIG. 6.

Figure 7A:
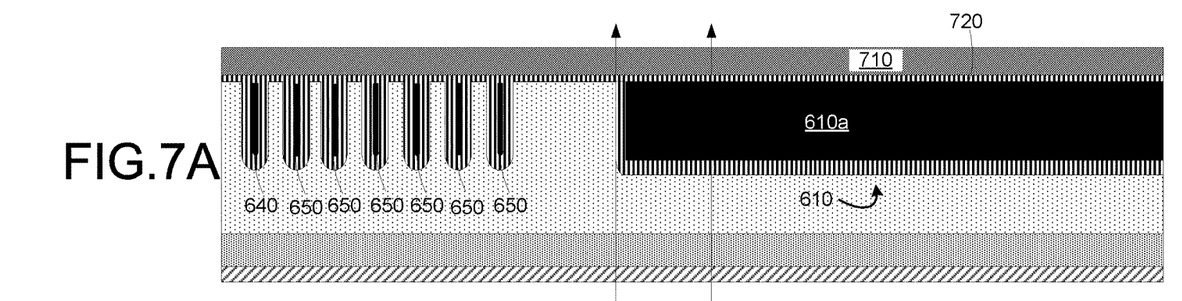
FIGS. 7A, 7B and 7C are diagrams illustrating cross-sectional views of the termination structure of FIG. 6 along a corresponding section lines in FIG. 6, according to an implementation.
Figure 7B:
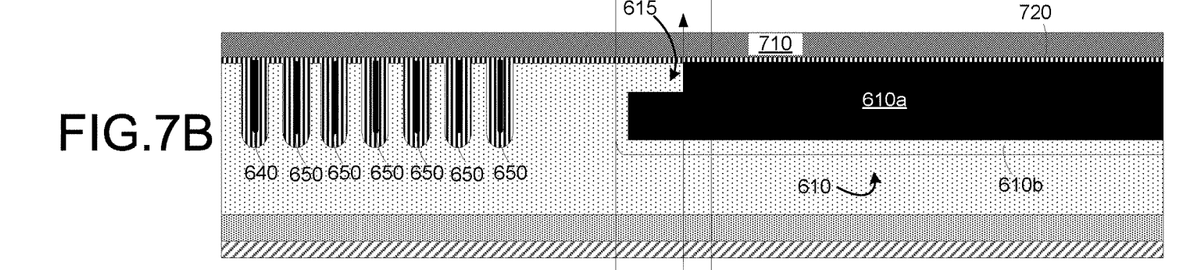
Figure 7C:
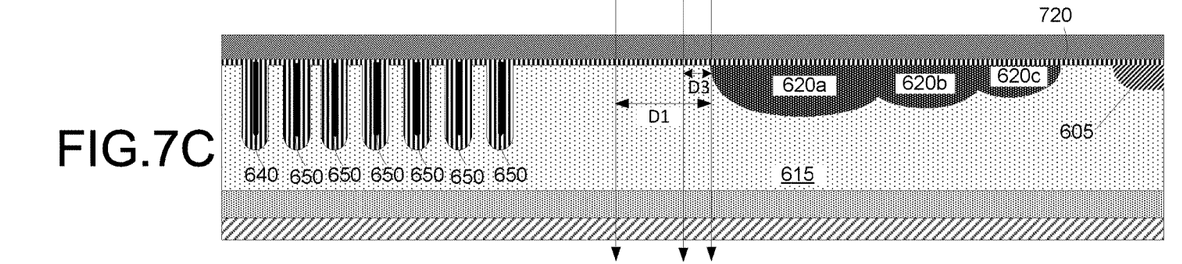

FIG. 7 is a diagram illustrating a cross-sectional view of the termination structure of FIG. 6 along a corresponding section line in FIG. 6, according to an implementation. In each of the cross-sections shown in FIGS. 7A-7C, the loading trenches 650 and the encircling trench 640 are shown. These trenches can include structures as those described herein. For instance, the trenches 640 and 650 can (as shown in FIGS. 6A-6C) include (have disposed therein) polysilicon electrodes that are disposed on a dielectric liner layer 620. The polysilicon electrodes can be tied to a potential (e.g., source potential) or can be floating. In other implementations, one or more of the trenches 640 and 650 can be dielectric filled (and not include a polysilicon electrode therein). As discussed above with respect to FIG. 6, the termination structure 600, as further illustrated by FIGS. 7A-7C, does not include perimeter trenches, such as perimeter trenches 130 and 430 as shown in FIGS. 1 and 4, respectively.

As shown in FIG. 7A, which is a cross-section view along section line 7A-7A in FIG. 6, the trench (termination trench) 610 can have a similar structure as the termination trenches 110 and 410 shown in FIGS. 2A and 4A disposed therein. For instance, the termination trench 610 can include a polysilicon electrode 610a (e.g., that is tied to a source potential of a corresponding power semiconductor device), where the electrode 610a is disposed on the dielectric liner layer 720. As shown in FIGS. 7A-7C, the termination structure 600 of FIG. 6 can include (have disposed thereon) an inter-layer dielectric layer 710. The dimensions (e.g., depths) of the trenches 610, 640 and 650 can be similar to those described herein. The N-enrichment implants 620*a*, 620*b* and 620*c* are not present in FIG. 7A, as the formation of the trench 610 removes a portion of the enrichment implants (e.g., where they intersect with the trench 610).

FIG. 7B illustrates a cross-section view of an alternative termination trench electrode that can be disposed in one or more of the termination trenches 610 of the termination structure 600 (or in termination trenches of other termination structures, such as those described herein). As compared with FIG. 7A, the trench shield electrode 610*a* in FIG. 7B includes a recessed (notched) portion 615. The recessed portion 615 can be filled with a dielectric 610*b*, which, in some implementations, can be implemented with the shield dielectric layer 720.

FIG. 7C illustrates a cross-sectional view along section line 7C-7C in FIG. 6, which is along a mesa 615 of the termination structure 600, and illustrates the N-enrichment implant regions 620*a*, 620*b* and 620*b*. As discussed above with respect to FIGS. 1 and 2B, and FIGS. 4 and 5B, the N-enrichment implant regions 620*a*, 620*b* and 620*c* in FIG. 7C are illustrated as overlapping each other. As noted above, such overlap can occur as a result of diffusion of the N-enrichment implant region 620*a*, 620*b* and 620*c* as shown in FIG. 6 due to thermal processing that occurs subsequent to implanting the stripes of the N-enrichment implant regions 620*a*, 620*b* and 620*c*. Such an arrangement can provide a desired graded lateral doping profile, which can increase available surface charge in the mesa 615. This increased surface charge can improve charge balance and prevent breakdown from occurring in the termination region of the termination structure 600 before it occurs in the active region (e.g., in an active cell of a corresponding power semiconductor device).

FIGS. 7A-7C also illustrate a spacing (as the distance D1) between an end of the termination trench 610 and a nearest edge of the N-enrichment implant region 620*a*. In similar fashion as discussed above with respect to FIGS. 1 and 2B, and FIGS. 4 and 5B, it will be appreciated that, as a result of the lateral diffusion of the N-enrichment implant stripes 620*a*, 620*b* and 620*b* shown in in FIG. 4, the distance D1 in FIG. 7C may be less than the corresponding distance (spacing) between the end of the termination trench 610 and the nearest edge of the N-enrichment region 620*a* stripe in FIG. 6. FIG. 7C also illustrates a spacing (as the distance D3) between the edge of the vertical edge of the indent (notch) in the trench termination electrode 610*a* (active area P-well 405 and a nearest edge of the N-enrichment lateral diffusion 620*a*. In implementations, the distance D3 can be 1 to 10 µm. While not specifically indicated in FIG. 7C, a spacing between the edge of the active area P-well 605 and a nearest edge of the N-enrichment implant region 620*c* may be less than the corresponding distance (spacing) between the edge of the active area P-well 605 and the nearest edge of the N-enrichment implant region 620*c* in FIG. 6.

As also shown in FIG. 7C, a depth of the N-enrichment region 720*a* (e.g., after lateral and vertical diffusion) can have a depth that is greater than respective depths of both the N-enrichment implant regions 620*b* and 620*c*. The N-enrichment region 620*b* (e.g., after lateral and vertical diffusion) can have a depth that is greater than the depth of the N-enrichment region 620*c*. As noted above, in some implementations, the depths of the N-enrichment implant regions 620*b*-620*c* (e.g., after diffusion due to thermal processing subsequent to implanting the N-enrichment region stripes shown in FIG. 6) can be less than or equal to 6 µm. In other implementations, other depths are possible.

In a first example, a power semiconductor device can include a semiconductor region having an active region and a termination region; a first trench shield electrode defined in the semiconductor region, the first trench shield electrode extending along a first longitudinal axis, the first trench shield electrode having a first portion disposed in the active region and a second portion disposed in the termination region; a second trench shield electrode defined in the semiconductor region, the second trench shield electrode extending along the first longitudinal axis in parallel with the first trench shield electrode, the second trench shield electrode having a first portion disposed in the active region and a second portion disposed in the termination region, a trench of the first trench shield electrode and a trench of the second trench shield electrode defining a mesa of the semiconductor region therebetween; and an implant enrichment region disposed in the termination region, the implant enrichment region extending along a second longitudinal axis that is orthogonal with the first longitudinal axis, the implant enrichment region being intersected by the first trench shield electrode and the second trench shield electrode, and having a portion disposed in the mesa of the semiconductor region, the portion extending from the trench of the first trench shield electrode to the trench of the second trench shield electrode.

In a second example based on the first example, the semiconductor region can be of a first conductivity type, the semiconductor region having a doping concentration that increases over a depth of the semiconductor region from a surface of the semiconductor region; the implant enrichment region can be of the first conductivity type and having a surface doping concentration that is greater than a surface doping concentration of the semiconductor region; and the active region can include a well region of a second conductivity type that is opposite the first conductivity type.

In a third example based on the second example, the first conductivity type can be N-type and the second conductivity type can be p-type.

In a fourth example based on any one of the previous examples, the implant enrichment region is: spaced, along the first longitudinal axis, a first distance from the active region; and spaced, along the first longitudinal axis, a second distance from respective ends of the first trench shield electrode and the second shield electrode.

In a fifth example based on any one of the previous examples, the implant enrichment region can have a first depth from a surface of the semiconductor region; and the first trench shield electrode and the second trench shield electrode can have a second depth from the surface of the semiconductor region, the first depth being less than the second depth.

In a sixth example based on the fifth example, the first depth can be less than or equal to 6 micrometers (µm) and the second depth can be greater than or equal to 6 µm.

In a seventh example based on any one of the previous examples, the implant enrichment region can be a first implant enrichment region, and the power semiconductor device can include: a second implant enrichment region disposed in the termination region between the first implant enrichment region and the active region, the second implant enrichment region extending along the second longitudinal axis in parallel with the first implant enrichment region, the second implant enrichment region being intersected by the first trench shield electrode and the second trench shield electrode, the second implant enrichment region having a portion disposed in the mesa of the semiconductor region, the portion of the second implant enrichment region extending from the trench of the first trench shield electrode to the trench of the second trench shield electrode.

In an eighth example based on the seventh example, the first implant enrichment region can have a first width along the first longitudinal axis; and the second implant enrichment region can have a second width along the first longitudinal axis, the second width being different than the first width.

In a ninth example based on the eighth example, the second width can be less than the first width.

In a tenth example based on any one of the seventh through ninth examples, the device can include a third implant enrichment region disposed in the termination region between the second implant enrichment region and the active region, the third implant enrichment region extending along the second longitudinal axis in parallel with the first implant enrichment region and the second implant enrichment region, the third implant enrichment region being intersected by the first trench shield electrode and the second trench shield electrode, the third implant enrichment region having a portion disposed in the mesa of the semiconductor region, the portion of the third implant enrichment region extending from the trench of the first trench shield electrode to the trench of the second trench shield electrode.

In an eleventh example based on the tenth example, the first implant enrichment region can have a first width along the first longitudinal axis; the second implant enrichment region can have a second width along the first longitudinal axis; and the third implant enrichment region can have a third width along the first longitudinal axis, the third width being less than the second width, and the second width being less than the first width.

In a twelfth example based on any one of the tenth and eleventh examples, the first implant enrichment region, the second implant enrichment region and the third implant enrichment region can have a same doping concentration dose.

In a thirteenth example based on any one of the previous examples, the first trench shield electrode can include a recessed portion disposed at an end of the first trench shield electrode in the termination region, the recessed portion of the first trench shield electrode being filled with a dielectric.

In a fourteenth example, a power semiconductor device can include: a semiconductor region having an active region and a termination region; a first implant enrichment region disposed in the termination region, the first implant enrichment region extending along a first longitudinal axis; a second implant enrichment region disposed in the termination region, the second implant enrichment region extending along the first longitudinal axis and in parallel with the first implant enrichment region, the second implant enrichment region being disposed between the first implant enrichment region and the active region; a first trench shield electrode defined in the semiconductor region, the first trench shield electrode extending along a second longitudinal axis that is orthogonal with the first longitudinal axis, the first trench shield electrode having a first portion disposed in the active region and a second portion disposed in the termination region; and a second trench shield electrode defined in the semiconductor region, the second trench shield electrode extending along the second longitudinal axis in parallel with the first trench shield electrode, the second trench shield electrode having a first portion disposed in the active region and a second portion disposed in the termination region, a trench of the first trench shield electrode and a trench of the second trench shield electrode defining a first mesa of the semiconductor region therebetween, the first trench shield electrode and the second trench shield electrode each intersecting the first implant enrichment region and the second implant enrichment region, a first portion of the first implant enrichment region and a first portion of the second implant enrichment region being disposed in the first mesa of the semiconductor region.

In a fifteenth example based on the fourteenth example, the device can include a third trench shield electrode defined in the semiconductor region, the third trench shield electrode extending along the second longitudinal axis in parallel with the first trench shield electrode and the second trench shield electrode, the third trench shield electrode having a first portion disposed in the active region and a second portion disposed in the termination region, the trench of the second trench shield electrode and a trench of the third trench electrode defining a second mesa of the semiconductor region therebetween, the third trench shield electrode intersecting the first implant enrichment region and the second implant enrichment region, a second portion of the first implant enrichment region and a second portion of the second implant enrichment region being disposed in the second mesa of the semiconductor region.

In a sixteenth example based on any one of the fourteenth and fifteenth examples, the semiconductor region can include an epitaxial layer having a graded doping concentration that increases, from an upper mesa surface to a bottom of the trench.

In a seventeenth example based on any one of the fourteenth through sixteenth examples, the device can include a third implant enrichment region disposed in the termination region, the third implant enrichment region extending along the second longitudinal axis and in parallel with the first implant enrichment region and the second implant enrichment region, the third implant enrichment region being disposed between the second implant enrichment region and the active region, the first trench shield electrode and the second trench shield electrode each intersecting the third implant enrichment region, a portion of the third implant enrichment region being disposed in the first mesa of the semiconductor region.

In an eighteenth example based on any one of the fourteenth through seventeenth examples, the first implant enrichment region and the second implant enrichment region can have an N-type implant dose of greater than or equal to $2.5 \times 10^{13}/cm^2$.

In a nineteenth example based on any one of the fourteenth through eighteenth examples, the first trench shield electrode can include a recessed portion disposed at an end of the first trench shield electrode in the termination region, the recessed portion of the first trench shield electrode being filled with a dielectric.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, adjacent to and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to or horizontally adjacent to.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A power semiconductor device comprising:
    a semiconductor region having an active region and a termination region;
    a first trench shield electrode defined in the semiconductor region, the first trench shield electrode extending along a first longitudinal axis, the first trench shield electrode having a first portion disposed in the active region and a second portion disposed in the termination region;
    a second trench shield electrode defined in the semiconductor region, the second trench shield electrode extending along the first longitudinal axis in parallel with the first trench shield electrode, the second trench shield electrode having a first portion disposed in the active region and a second portion disposed in the termination region, a trench of the first trench shield electrode and a trench of the second trench shield electrode defining a mesa of the semiconductor region therebetween; and
    an implant enrichment region disposed in the termination region, the implant enrichment region extending along a second longitudinal axis that is orthogonal with the first longitudinal axis,
    the implant enrichment region being intersected by the first trench shield electrode and the second trench shield electrode, and having a portion disposed in the mesa of the semiconductor region, the portion extending from the trench of the first trench shield electrode to the trench of the second trench shield electrode.

2. The power semiconductor device of claim 1, wherein:
    the semiconductor region is of a first conductivity type, the semiconductor region having a doping concentration that increases over a depth of the semiconductor region from a surface of the semiconductor region;
    the implant enrichment region is of the first conductivity type and has a surface doping concentration that is greater than a surface doping concentration of the semiconductor region; and
    the active region includes a well region of a second conductivity type that is opposite the first conductivity type.

3. The power semiconductor device of claim 2, wherein the first conductivity type is N-type and the second conductivity type is p-type.

4. The power semiconductor device of claim 1, wherein the implant enrichment region is:
    spaced, along the first longitudinal axis, a first distance from the active region; and
    spaced, along the first longitudinal axis, a second distance from respective ends of the first trench shield electrode and the second shield electrode.

5. The power semiconductor device of claim 1, wherein the implant enrichment region is a first implant enrichment region, the power semiconductor device further comprising:
    a second implant enrichment region disposed in the termination region between the first implant enrichment region and the active region, the second implant enrichment region extending along the second longitudinal axis in parallel with the first implant enrichment region, the second implant enrichment region being intersected by the first trench shield electrode and the second trench shield electrode, the second implant enrichment region having a portion disposed in the mesa of the semiconductor region, the portion of the second implant enrichment region extending from the trench of the first trench shield electrode to the trench of the second trench shield electrode.

6. The power semiconductor device of claim 5, wherein:
    the first implant enrichment region has a first width along the first longitudinal axis; and
    the second implant enrichment region has a second width along the first longitudinal axis,
    the second width being different than the first width.

7. The power semiconductor device of claim 6, wherein the second width is less than the first width.

8. The power semiconductor device of claim 5, further comprising:
    a third implant enrichment region disposed in the termination region between the second implant enrichment region and the active region, the third implant enrichment region extending along the second longitudinal axis in parallel with the first implant enrichment region and the second implant enrichment region, the third implant enrichment region being intersected by the first trench shield electrode and the second trench shield electrode, the third implant enrichment region having a portion disposed in the mesa of the semiconductor region, the portion of the third implant enrichment region extending from the trench of the first trench shield electrode to the trench of the second trench shield electrode.

9. The power semiconductor device of claim 8, wherein:
    the first implant enrichment region has a first width along the first longitudinal axis;
    the second implant enrichment region has a second width along the first longitudinal axis; and the third implant enrichment region has a third width along the first longitudinal axis, the third width being less than the second width, and the second width being less than the first width.

10. The power semiconductor device of claim 8, wherein the first implant enrichment region, the second implant enrichment region and the third implant enrichment region have a same implant dose.

11. The power semiconductor device of claim 1, wherein:
the implant enrichment region has a first depth from a surface of the semiconductor region; and
the first trench shield electrode and the second trench shield electrode have a second depth from the surface of the semiconductor region,
the first depth being less than the second depth.

12. The power semiconductor device of claim 11, wherein the first depth is less than or equal to 6 micrometers (μm) and the second depth is greater than or equal to 6 μm.

13. The power semiconductor device of claim 1, wherein the first trench shield electrode includes a recessed portion disposed at an end of the first trench shield electrode in the termination region, the recessed portion of the first trench shield electrode being filled with a dielectric.

14. A power semiconductor device comprising:
a semiconductor region having an active region and a termination region;
a first implant enrichment region disposed in the termination region, the first implant enrichment region extending along a first longitudinal axis;
a second implant enrichment region disposed in the termination region, the second implant enrichment region extending along the first longitudinal axis and in parallel with the first implant enrichment region, the second implant enrichment region being disposed between the first implant enrichment region and the active region;
a first trench shield electrode defined in the semiconductor region, the first trench shield electrode extending along a second longitudinal axis that is orthogonal with the first longitudinal axis, the first trench shield electrode having a first portion disposed in the active region and a second portion disposed in the termination region; and
a second trench shield electrode defined in the semiconductor region, the second trench shield electrode extending along the second longitudinal axis in parallel with the first trench shield electrode, the second trench shield electrode having a first portion disposed in the active region and a second portion disposed in the termination region, a trench of the first trench shield electrode and a trench of the second trench shield electrode defining a first mesa of the semiconductor region therebetween, the first trench shield electrode and the second trench shield electrode each intersecting the first implant enrichment region and the second implant enrichment region, a first portion of the first implant enrichment region and a first portion of the second implant enrichment region being disposed in the first mesa of the semiconductor region.

15. The power semiconductor device of claim 14, further comprising:
a third trench shield electrode defined in the semiconductor region, the third trench shield electrode extending along the second longitudinal axis in parallel with the first trench shield electrode and the second trench shield electrode, the third trench shield electrode having a first portion disposed in the active region and a second portion disposed in the termination region, the trench of the second trench shield electrode and a trench of the third trench electrode defining a second mesa of the semiconductor region therebetween,
the third trench shield electrode intersecting the first implant enrichment region and the second implant enrichment region, a second portion of the first implant enrichment region and a second portion of the second implant enrichment region being disposed in the second mesa of the semiconductor region.

16. The power semiconductor device of claim 14, wherein the semiconductor region includes an epitaxial layer having a graded doping concentration that increases, from an upper mesa surface to a bottom of the trench.

17. The power semiconductor device of claim 14, further comprising:
a third implant enrichment region disposed in the termination region, the third implant enrichment region extending along the second longitudinal axis and in parallel with the first implant enrichment region and the second implant enrichment region, the third implant enrichment region being disposed between the second implant enrichment region and the active region,
the first trench shield electrode and the second trench shield electrode each intersecting the third implant enrichment region, a portion of the third implant enrichment region being disposed in the first mesa of the semiconductor region.

18. The power semiconductor device of claim 14, wherein the first implant enrichment region and the second implant enrichment region have an N-type implant dose of greater than or equal to $2.5 \times 10^{13}/cm^2$.

19. The power semiconductor device of claim 14, wherein the first trench shield electrode includes a recessed portion disposed at an end of the first trench shield electrode in the termination region, the recessed portion of the first trench shield electrode being filled with a dielectric.

* * * * *